US007666776B2

(12) United States Patent
Collins et al.

(10) Patent No.: US 7,666,776 B2
(45) Date of Patent: Feb. 23, 2010

(54) METHODS OF FORMING CONDUCTIVE STRUCTURES

(75) Inventors: Dale W. Collins, Boise, ID (US); Rita J. Klein, Boise, ID (US); James E. Green, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 408 days.

(21) Appl. No.: 11/218,232

(22) Filed: Sep. 1, 2005

(65) Prior Publication Data
US 2007/0048932 A1 Mar. 1, 2007

(51) Int. Cl.
*H01L 21/44* (2006.01)
(52) U.S. Cl. .................. 438/597; 438/598; 438/669; 257/E21.627
(58) Field of Classification Search ............. 438/598, 438/618, 666, 669, 597, 621–625, 627–629, 438/637–644; 257/E21.627
See application file for complete search history.

(56) References Cited

U.S. PATENT DOCUMENTS

| 6,162,671 | A  * | 12/2000 | Lee et al. ............. 438/238 |
| 6,518,670 | B1 * | 2/2003 | Mandelman et al. ....... 257/752 |
| 6,780,753 | B2 * | 8/2004 | Latchford et al. .......... 438/619 |
| 6,781,182 | B2 * | 8/2004 | Drynan ..................... 257/306 |
| 6,787,836 | B2 * | 9/2004 | Clevenger et al. .......... 257/296 |
| 6,926,818 | B1 * | 8/2005 | Lin et al. .................. 205/123 |
| 7,119,000 | B2 * | 10/2006 | Shimizu et al. ............ 438/597 |
| 7,300,869 | B2 * | 11/2007 | Sun et al. .................. 438/648 |
| 7,410,833 | B2 * | 8/2008 | Fogel et al. ............... 438/123 |
| 2004/0173912 | A1 * | 9/2004 | Rhodes ..................... 257/774 |
| 2004/0192019 | A1 * | 9/2004 | Seshan et al. ............. 438/617 |

OTHER PUBLICATIONS

Eisenbraun. E. et al., "Atomic Layer Deposition(ALD) of Tantalum Based Materials for Zero Thickness Copper Barrier Applications", IEEE Jun. 2001, pp. 207-209.
Besling, W. et al., Atomic Layer Deposition of Barriers for Interconnect, IEEE Jun. 2002, pp. 288-291.

* cited by examiner

*Primary Examiner*—Charles D Garber
*Assistant Examiner*—Stanetta D Isaac
(74) *Attorney, Agent, or Firm*—Wells St. John, P.S.

(57) ABSTRACT

The invention includes methods of forming pluralities of electrically conductive structures. The methods can include formation of a gradient-containing material across a substrate and in direct physical contact with conductive surfaces of nodes. The gradient-containing material can consist essentially of tantalum nitride at a lowermost portion in contact with the conductive surfaces, consist essentially of tantalum at an uppermost portion, and have a TaN/Ta gradient extending between the lowermost and uppermost portions. Alternatively, the gradient-containing material can have a Co/W gradient extending therethrough. Conductive structures can be formed over the gradient-containing material. The invention also includes constructions comprising electrically conductive lines over a material having a TaN/Ta gradient, or a W/Co gradient, extending therethrough.

28 Claims, 5 Drawing Sheets

METHODS OF FORMING CONDUCTIVE STRUCTURES

TECHNICAL FIELD

The invention pertains to semiconductor constructions comprising electrically conductive structures, and pertains to methods of forming electrically conductive structures.

BACKGROUND OF THE INVENTION

Numerous electrically conductive structures are utilized in semiconductor devices. For instance, conductive lines are utilized in semiconductor constructions for interconnecting circuit elements. It is common to form large grids of conductive lines associated with memory arrays, with the lines being configured for providing access to individual memory devices of the arrays. Conductive lines can also be utilized peripherally to the memory arrays to interconnect peripheral circuitry, as well as to connect peripheral circuitry to the memory arrays. Additionally, conductive lines can be used to provide electrical access between circuitry associated with a semiconductor substrate (i.e., circuitry associated with a semiconductor die), and circuitry external to the semiconductor substrate. Various conductive lines can correspond to so-called metal (I), metal (II), metal (III), metal (IV), metal (V), etc. layers.

A continuing goal of integrated circuit fabrication is to increase the density of integration, which leads to a corresponding goal to pack an ever-increasing number of conductive structures (such as lines) into ever-decreasing space. This leads to challenges in conductive structure fabrication, and it is desirable to develop new methods for conductive structure fabrication which can address such challenges.

Another goal in semiconductor device fabrication is to reduce the costs associated with device fabrication while maintaining or increasing throughput. For this additional reason, it is desired to develop new methods for fabrication of conductive lines.

SUMMARY OF THE INVENTION

In one aspect, the invention includes a method of forming a plurality of electrically conductive structures. A semiconductor substrate is provided. An electrically conductive layer is formed across the substrate. The electrically conductive layer has defined first regions and defined second regions between the first regions. A material is provided to cover the second regions while leaving the first regions uncovered. A plurality of spaced electrically conductive structures are formed within the uncovered regions. The structures are spaced from one another by the material. A protective layer can be formed over the electrically conductive structures. After the protective layer is formed, the material is removed, and the second regions of the at least one electrically conductive layer are removed. After the second regions of the at least one electrically conductive layer are removed, the protective layer can be removed. In some aspects, the electrically conductive layer can comprise a gradient extending therethrough, with such gradient being, for example, a Ta/TaN gradient or a Co/W gradient. In other aspects, the electrically conductive layer can be without a gradient extending therethrough.

In one aspect, the invention includes a semiconductor construction. The construction comprises a semiconductor substrate having a plurality of spaced electrically conductive nodes. A plurality of spaced blocks of an electrically conductive material are in direct physical contact with uppermost surfaces of the nodes. The electrically conductive material can, for example, consist essentially of tantalum nitride at a lowermost portion proximate the nodes, consist essentially of tantalum at an uppermost portion, and comprise a tantalum nitride/tantalum gradient extending from the lowermost portion to the uppermost portion. Alternatively, the electrically conductive material can, for example, consist of tantalum throughout; or can consist of tungsten and cobalt and have a tungsten/cobalt gradient therein; or can consist of one or more of tantalum, tungsten, tungsten nitride, and ruthenium.

In one aspect, the invention includes a method of forming a plurality of electrically conductive lines. A substrate is provided to have a plurality of conductive surfaces. A conductive barrier material is formed across the substrate and in direct physical contact with the conductive surfaces. The conductive barrier material can be a single homogenous material (such as pure Ta), a bi-layer (such as a Ta layer and a TaN layer), or a gradient-containing material. An exemplary gradient-containing material can consist essentially of tantalum nitride at a lowermost portion in contact with the conductive surfaces, consist essentially of tantalum at an uppermost portion, and have a tantalum nitride/tantalum gradient extending between the lowermost and uppermost portions. Another exemplary gradient-containing material can be a material containing a Co/W gradient therein. The conductive barrier material has defined first regions directly over the conductive surfaces and defined second regions between the first regions. A sacrificial material is formed over the conductive barrier material. The sacrificial material has openings extending therethrough to the defined first regions. A plurality of spaced electrically conductive lines are formed within the openings. The lines are spaced from one another by the sacrificial material. Caps are formed to protect the electrically conductive lines. The caps comprise a material resistant to an etch. While the caps protect the electrically conductive lines, the sacrificial material is removed and then the etch is utilized to remove the second regions of the conductive barrier material. In some aspects, the lines can be formed directly on an insulative material rather than over the conductive surfaces.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods which can be utilized to form electrically conductive structures (such as interconnects) associated with semiconductor devices. In some aspects, the methodology of the present invention can eliminate problematic process steps associated with conventional fabrication of interconnects. The invention can also include aspects in which protective layers are formed over conductive structures during fabrication of the conductive structures, which can enable a dry etch to be utilized without problematic aspects known to occur during utilization of dry etches in prior art fabrication processes.

Exemplary aspects of the invention are described with reference to FIGS. 1-10.

Figure 1:
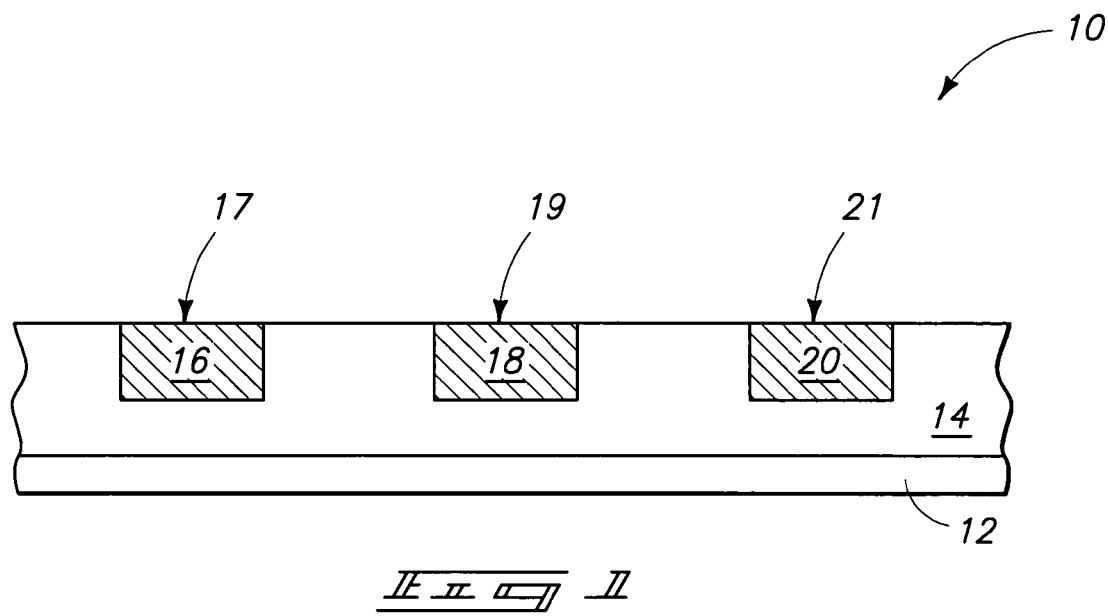
FIG. 1 is a diagrammatic, cross-sectional view of a semiconductor wafer fragment shown at a preliminary processing stage of an exemplary aspect of the present invention.

Referring initially to FIG. 1, a semiconductor construction 10 is illustrated at a preliminary processing stage. The construction comprises a supporting substrate 12. Such substrate can be a semiconductor substrate, and accordingly can include one or more semiconductive materials, such as, for example, silicon. In particular aspects, the substrate can include bulk monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically insulative material 14 is provided over supporting substrate 12, and a plurality of spaced electrically conductive nodes 16, 18 and 20 are provided within the insulative material. Insulative material 14 can comprise any composition or combination of compositions having electrically insulative properties; and in particular aspects can comprise, consist essentially of, or consist of borophosphosilicate glass (BPSG) and/or SiO$_2$. Although base material 12 is referred to above as a "supporting substrate", the definition of "substrate" is broad enough as utilized herein so that the combination of materials 12 and 14 can also be considered a substrate.

The electrically conductive nodes 16, 18 and 20 can comprise any composition or combination of compositions having electrically conductive properties, and in particular aspects can comprise metals, metal compositions and/or conductively-doped semiconductor materials (such as, for example, conductively-doped silicon). In exemplary aspects, the conductive nodes can comprise, consist essentially of, or consist of tungsten.

The conductive nodes are shown to be rectangular plugs in the cross-sectional view of FIG. 1, but it is to be understood that the nodes can have any suitable geometry. In some exemplary aspects the nodes will correspond to elongated structures which extend into and out of the page relative to the cross-sectional view of FIG. 1. Also, it is to be understood that the nodes can have the same geometrical configurations relative to one another (as shown), or can have different geometrical configurations relative to one another. Also, it is to be understood that the nodes can be omitted in some aspects of the invention, and subsequent processing (described below) can be utilized to form conductive structures (such as the lines 44, 46 and 48 of FIGS. 4-8) directly on material 14 rather than on conductive nodes.

Although material 14 is described as an insulative material, it is to be understood that the material 14 can also correspond to a bulk semiconductor material in some aspects. Accordingly, material 14 can be an extension of bulk material from supporting substrate 12, and in such aspects nodes 16, 18 and 20 can be conductively-doped diffusion regions extending into the bulk semiconductor material.

The processing stage of FIG. 1 can correspond to any processing stage of a semiconductor wafer fabrication sequence, including, for example, a processing stage immediately prior to or after formation of metal (I) layers, metal (II) layers, metal (III) layers, metal (IV) layers, etc. For example, the processing stage can be early in a fabrication process so that circuit devices are not yet formed in underlying substrate 12. As another example, the processing stage of FIG. 1 can be a stage relatively late in a fabrication process so that multiple circuit elements and devices (not shown) have already been formed in underlying substrate 12. Accordingly, the underlying substrate 12 can comprise a combination of insulative materials, conductive materials and semiconductor materials.

Nodes 16, 18 and 20 have uppermost surfaces 17, 19 and 21 to which electrically conductive interconnects are ultimately desired to be coupled. As indicated previously, the term "substrate" is defined herein to be broad enough to encompass various combinations of materials. Thus, all of the structures 12, 14, 16 and 20 can be, in some aspects, considered to form a substrate, and such substrate can be considered to have a plurality of spaced conductive surfaces corresponding to surfaces 17, 19, and 21. Surfaces 17, 19 and 21 are exposed at the processing stage of FIG. 1.

Figure 2:
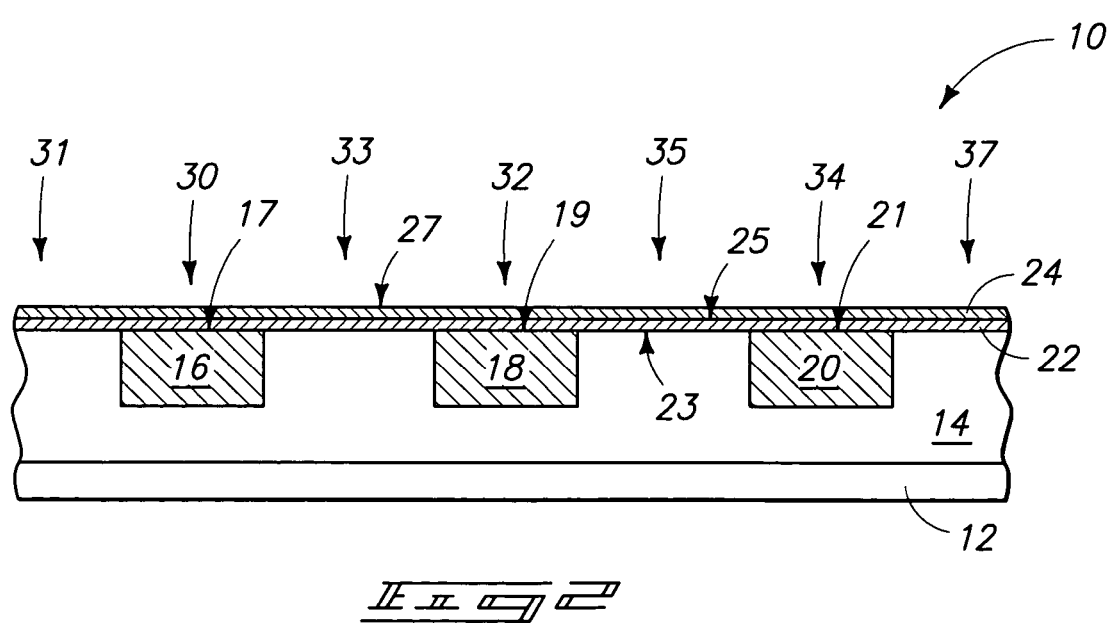
FIG. 2 is view of the FIG. 1 wafer fragment shown at a processing stage subsequent to that of FIG. 1.

Referring next to FIG. 2, a pair of electrically conductive layers 22 and 24 are formed over nodes 16,18 and 20, with the layers 22 and 24 being compositionally different from one another. Layer 22 can be referred to as a first electrically conductive layer, and layer 24 can be referred to as a second electrically conductive layer.

Layer 22 can correspond to a barrier material, and in some aspects can be referred to as a conductive barrier material. The conductive barrier material can be, for example, a single homogenous material (such as pure Ta), or a gradient-containing material. The shown single layer 22 can be replaced with a multi-layer stack in some aspects of the invention, and can, for example, correspond to a bi-layer stack (such as a Ta layer stacked with a TaN layer).

In some exemplary aspects, the electrically conductive material of layer 22 can consist of tantalum throughout; or can consist of tungsten and cobalt and have a tungsten/cobalt gradient therein; or can comprise, consist essentially of, or consist of one or more of the primary components of cobalt, nickel, tantalum, tungsten, tungsten nitride, and ruthenium. The primary components can be utilized in a single barrier layer, either individually, or in compositional gradients. Alternatively, the primary components can be utilized in multi-stack configurations. Dopants, such as, for example, phosphorus can be included in the barrier materials with one or more of the primary components. For instance, material of layer 22 can comprise, consist essentially of, or consist of phosphorus-doped cobalt tungsten in some aspects of the invention. The phosphorus-doped cobalt tungsten may, in some aspects, be formed over tungsten plugs and oxide using colloidal Pd activation.

In particular exemplary aspects, layer 22 can consist of a gradient-containing material. Such gradient-containing material can contain a compositional gradient extending from a lowermost surface of layer 22 to an uppermost surface of the layer. Thus, the layer can consist of a first composition at the lowermost surface, a second composition at the uppermost surface, and a first composition/second composition gradient extending between the first and second surfaces.

Layer 22 is shown having a lowermost portion 23 in direct physical contact with the uppermost surfaces 17, 19 and 21 of nodes 16, 18 and 20, and having an uppermost portion 25 in opposing relation to the lowermost surface. In some aspects, layer 22 can consist essentially of tantalum nitride at lowermost portion 23, consist essentially of tantalum at uppermost portion 25, and comprise a tantalum nitride/tantalum gradient extending between the lowermost and uppermost portions. The gradient can, in some aspects, be a substantially linear gradient in which the ratio of tantalum to tantalum nitride increases uniformly throughout the layer from the portion 23 having essentially 100% tantalum nitride and 0% tantalum, to the portion 25 having substantially 100% tantalum and 0% tantalum nitride. In other aspects, the layer can comprise a different compositional gradient than the TaN/Ta gradient, with an exemplary other gradient being a Co/W gradient. In some aspects, Co/W can be used without being in the form of a compositional gradient.

Layer 22 can be formed utilizing any suitable process, including, for example, atomic layer deposition, chemical vapor deposition and/or physical vapor deposition.

Layer 24 is formed in direct physical contact with an upper surface of layer 22, and itself has an exposed upper surface 27. The upper surface 27 of layer 24 can be a nucleation surface utilized for subsequent growth of conductive materials during an electroplating or electroless deposition process. Layer 24 can comprise, consist essentially of, or consist of one or more of cobalt, copper, nickel, ruthenium, tungsten, or any other suitable material, including, for example, various noble metals.

Layer 24 can be formed by any suitable processing, including, for example, chemical vapor deposition, atomic layer deposition, electroless plating, electroplating and/or physical vapor deposition.

Layers 22 and 24 can have any suitable thicknesses. In some aspects, layer 22 can be thicker than layer 24 because layer 22 has barrier properties desired to be retained in final structures incorporating the layer. It can be advantageous to form both of layers 22 and 24 as thin as possible while retaining desired characteristics of the layers, as such layers will ultimately be removed in subsequent etching (as discussed below with reference to FIG. 8). Accordingly, it can be advantageous that each of the layers have a thickness of less than or equal to about 125 Å. In particular aspects, at least layer 24 will have a thickness of from about 60 to about 125 Å, or even from about 10 Å to 100 Å; and in other aspects both of layers 22 and 24 will have thicknesses in the range of from about 60 Å to about 125 Å, or even from about 10 Å to about 100 Å.

Although the invention is described as utilizing two types of layers over the electrical nodes to provide suitable barrier properties (which are provided by layer 22 in the shown exemplary aspect of the invention) and suitable nucleation properties (which are provided layer 24 in the shown exemplary aspect of the invention), it is to be understood that more than two types layers can be utilized in some aspects of the invention, (for example, if it is desired to have an additional layer under the nucleation layer to provide additional barrier properties). It is also to be understood that only one homogeneous layer can be utilized in some aspects of the invention if a single layer can provide desired barrier and nucleation properties. For instance, a layer comprising, consisting essentially of, or consisting of tungsten, tantalum, ruthenium or phosphorus-doped cobalt tungsten can, in some aspects, be suitable to provide both the desired barrier properties and the desired nucleation properties. Also, a gradient-containing material, such as one of the materials described above with reference to exemplary aspects of layer 22, can be utilized alone to provide both desired barrier properties and desired nucleation properties in some aspects of the invention.

Layers 22 and 24 extend over nodes 16, 18 and 20, and also extend over regions between the nodes. The layers can be defined to comprise first regions 30, 32 and 34 which extend at least partially across the nodes, and second regions 31, 33, 35 and 37 which extend between the first regions. Such definitions aid in explaining the invention that follows, but it is to be understood that the defined first and second regions are only loosely tied to the locations of the nodes. In other words, the first regions can extend outwardly beyond the nodes, and/or the second regions can partially overlap the nodes. Typically, the first regions will extend entirely across the nodes and laterally outward beyond outermost lateral peripheries of the nodes, and the second regions will not overlap the nodes. Also, as discussed above, some aspects of the invention can comprise forming layers 22 and 24 entirely over an insulative material, rather than over conductive nodes. In such aspects, the utilization of defined first and second regions of the layers 22 and 24 can still be useful in describing processing occurring subsequent to formation of layers 22 and 24.

Figure 3:
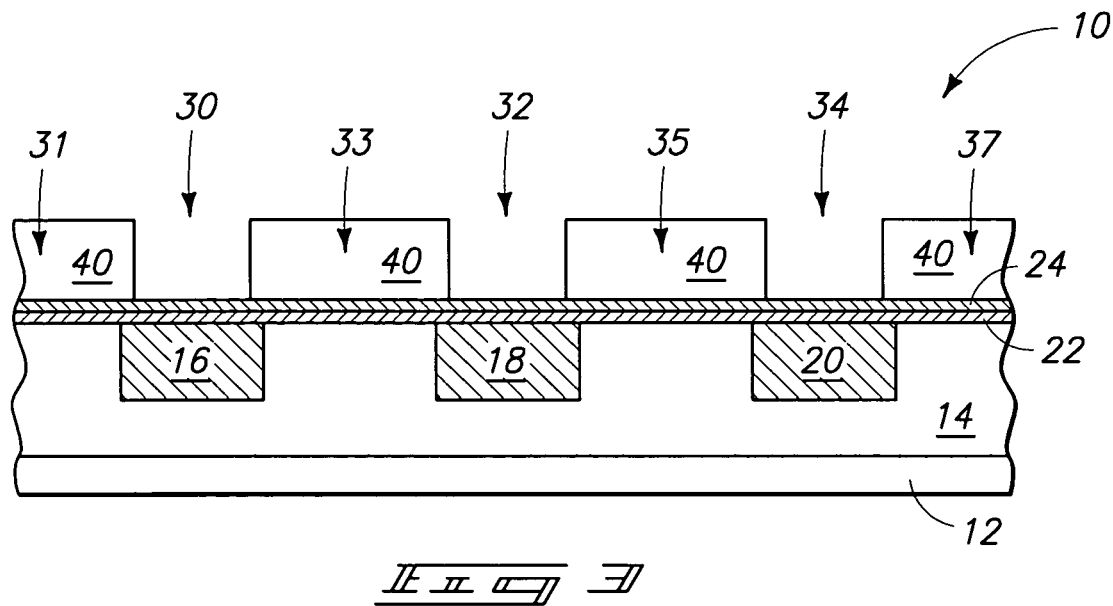
FIG. 3 is a view of the FIG. 1 wafer fragment shown at a processing stage subsequent to that of FIG. 2.

Typical exemplary locations of the defined first and second regions are more clearly shown in FIG. 3, where a sacrificial material 40 is shown formed over layer 24 and patterned such that the material covers defined second regions 31, 33, 35 and 37, while leaving defined first regions 30, 32 and 34 uncovered. Material 40 can be considered to comprise openings extending therethrough to defined first regions 30, 32 and 34, and in some aspects can be considered to be a patterned mask. Material 40 can comprise any suitable composition, and in some aspects comprises photolithographically patterned photoresist. In the shown aspect of the invention, material 40 is formed directly against layer 24.

Figure 4:
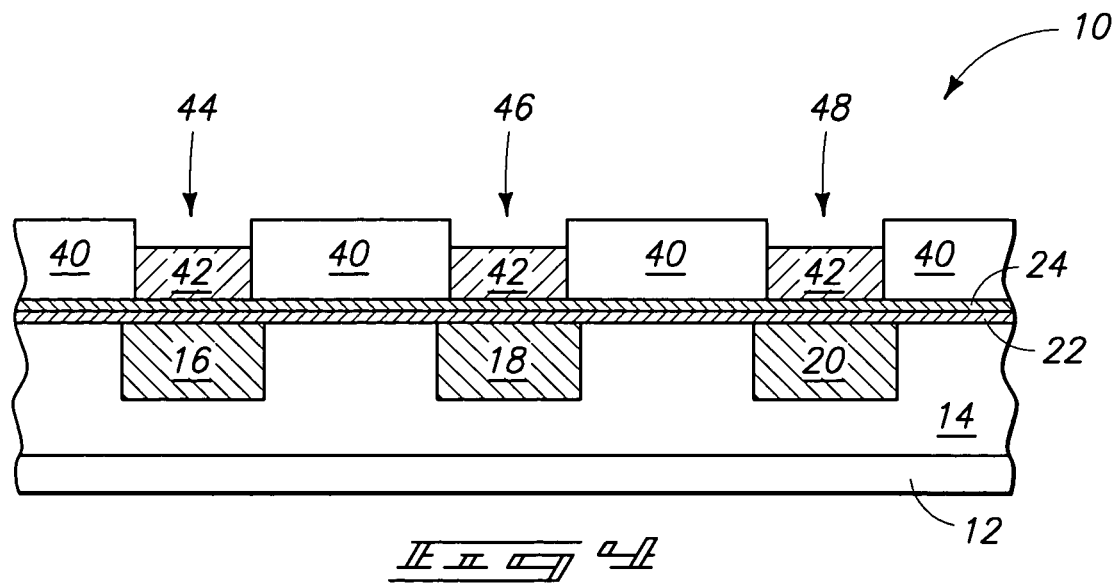
FIG. 4 is a view of the FIG. 1 wafer fragment shown at a processing stage subsequent to that of FIG. 3.

Referring to FIG. 4, a conductive material 42 is formed within the openings extending through mask 40. Conductive material 42 corresponds to spaced electrically conductive structures 44, 46 and 48; with such structures being spaced from one another by intervening blocks of second material 40. The structures 44, 46 and 48 can correspond to electrically conductive lines (or other interconnects) extending into and out of the page relative to the cross-sectional view of FIG. 4. Alternatively, the structures 44, 46 and 48 can correspond to other circuit components besides lines or interconnects.

Material 42 can comprise any suitable electrically conductive material, and in particular aspects will comprise, consist essentially of, or consist of one or more of copper, cobalt, nickel or any of various noble metals. The metals can be in pure form or in the form of any suitable alloy or combination of alloys. The material 42 can be formed by any suitable method, including, for example, electrolytic plating or electroless deposition. If electrolytic plating is utilized, upper conductive layer 24 is electrically coupled to a power source and electrically biased relative to an anode. Subsequently, material is electrolytically transferred to a plating surface (in other words, electrically reduced onto the plating surface) to form the interconnects 44, 46 and 48. The plating surface is a surface onto which material is plated during the growth of material 42 over layer 24. Such surface would initially correspond to an upper surface of layer 24, but would subsequently correspond to growing surfaces of material 42.

As is known to persons of ordinary skill in the art, materials would be transferred to the plating surface during the electroplating process from an electrolytic bath. Such materials can come from an anode surface, and/or may be materials which are initially dissolved in the bath.

It can be desired that the electroplating be conducted with a suitable voltage between the plating surface and the anode during the electroplating operation to preclude migration of electroplated materials under blocks 40 (in other words, to avoid dissolution of native oxide on material 24 that could otherwise lead to an undercut between materials 40 and 24). This will enable the electroplated material of 42 to grow within the openings between the blocks while not significantly extending to under the blocks. It is desired to avoid having the electroplated material grow under the blocks, because the electroplated material can otherwise problematically push the blocks off of the substrate. Any suitable bias voltage can be utilized, with preferred bias voltages being suitable to plate at a reasonable rate while substantially avoiding oxide undercutting, and while substantially avoiding etching of exposed regions of conductive material 24 and conductive material 22. An exemplary bias voltage is a voltage greater than or equal to about 2volts. In aspects in which copper is electroplated, the entry bias can be, for example from about 2volts to about 10volts, and the plating bath can be relatively low resistance.

If electrochemical deposition (for instance, electroless deposition) is utilized to form conductive material 42, any suitable precursors and operating conditions can be utilized. Exemplary bath components can include any components known in the art for deposition of a desired material 42; which in some aspects can included components suitable for deposition of one or more of Co, Ni and Cu.

Although material 42 is shown only partially filling the openings between blocks 40, it is to be understood that the material 42 can be grown to any desired height. Accordingly, in some aspects material 42 can be grown to a height which fully fills the openings, or even overfills the openings.

Figure 5:
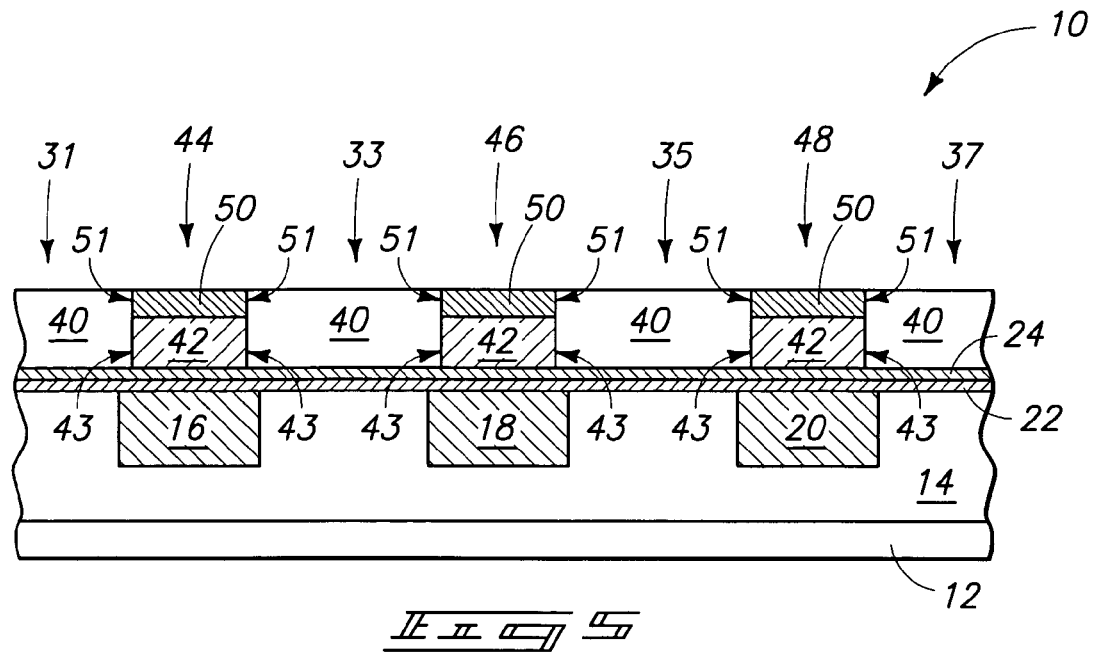
FIG. 5 is a view of the FIG. 1 wafer fragment shown at a processing stage subsequent to that of FIG. 4.

Referring to FIG. 5, caps 50 are formed over the material 42 of lines 44, 46 and 48. Caps 50 can correspond to a protective layer utilized to protect material 42 during a subsequent etch (described below with reference to FIG. 8). This protective layer can comprise an electrically conductive material different from the electrically conductive material of lines 42, or can be the same material as lines 42, and can be formed by, for example, electroplating or electroless deposition.

In particular aspects, caps 50 comprise, consist essentially of, or consist of one or more of nickel, cobalt, phosphorus-doped cobalt tungsten, boron-doped cobalt tungsten, phosphorus-doped nickel, phosphorus-doped cobalt, phosphorus-doped nickel molybdenum and boron-doped nickel molybdenum.

Although the caps are shown formed within portions of openings over material 42 of interconnects 44, 46 and 48, it is to be understood that the caps can also be formed outwardly of the openings in, for example, applications in which material 42 fills the openings. In such aspects, the caps can extend laterally outwardly beyond lateral edges of material 42. In the shown aspect of the invention, however, material 42 has lateral edges 43, and the material 50 has lateral edges 51 which are laterally coextensive with such edges 43. Accordingly, the combined materials 42 and 50 of the lines together form substantially planar lateral sidewalls comprising the surfaces 43 and 51.

Figure 6:
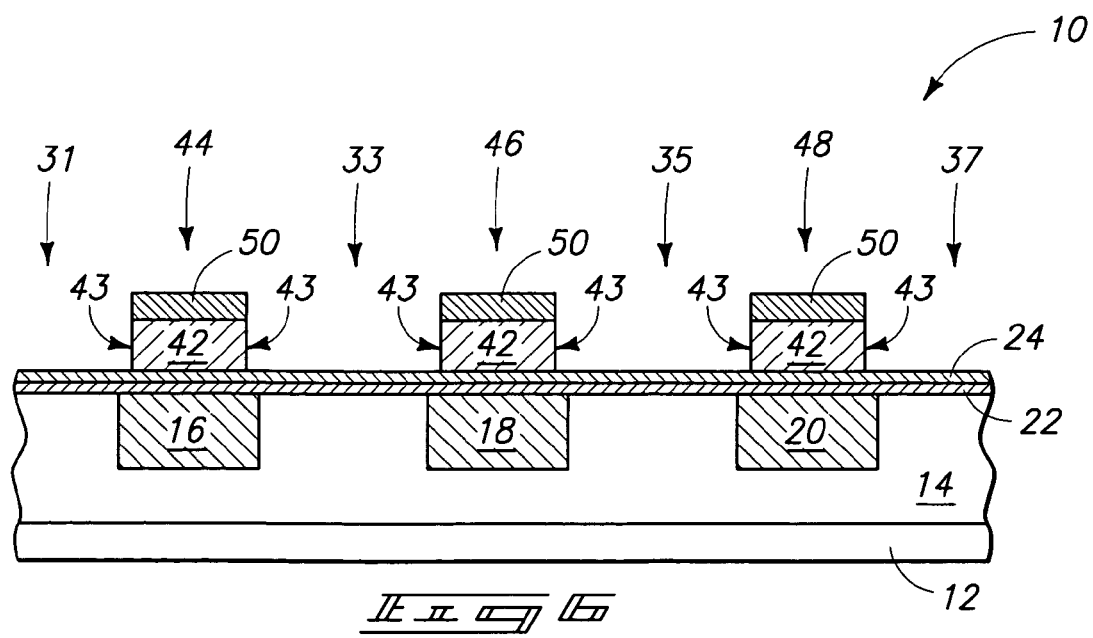
FIG. 6 is a view of the FIG. 1 wafer fragment shown at a processing stage subsequent to that of FIG. 5.

Referring to FIG. 6, material 40 (FIG. 5) is removed to expose the second regions of layer 24 between the lines 44, 46 and 48. Such also exposes sidewalls 43 of the material 42 of the lines.

Figure 7:
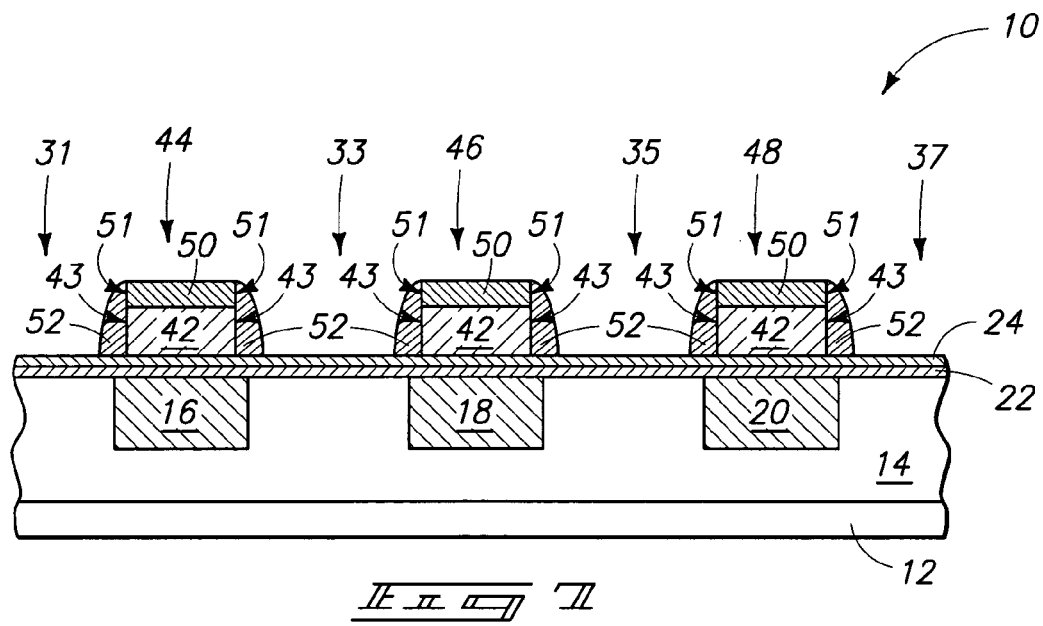
FIG. 7 is a view of the FIG. 1 wafer fragment shown at a processing stage subsequent to that of FIG. 6.

Referring to FIG. 7, protective material 52 is formed along the sidewalls 43. Materials 50 and 52 can be considered to correspond to a first and second protective layer, respectively, with the first layer being formed over the top surfaces of material 42 and the second layer being formed along the sidewall surfaces of the material 42. Material 52 can have the same composition as material 50 or a different composition. Material 52 can, in exemplary aspects, be formed utilizing electroplating or electroless deposition.

Material 52 is shown forming sidewall spacers extending along sidewalls 43 and 51 of materials 42 and 50. Such can be accomplished by initially forming material 52 to cover all upper surfaces of construction 10, and then utilizing an anisotropic dry etch to remove material 50 from locations other than along the sidewalls 43 and 51. Such etching will remove material 52 from over an upper surface of material 50, and from over the upper surfaces of material 24 in second regions 31, 33, 35 and 37.

Figure 8:
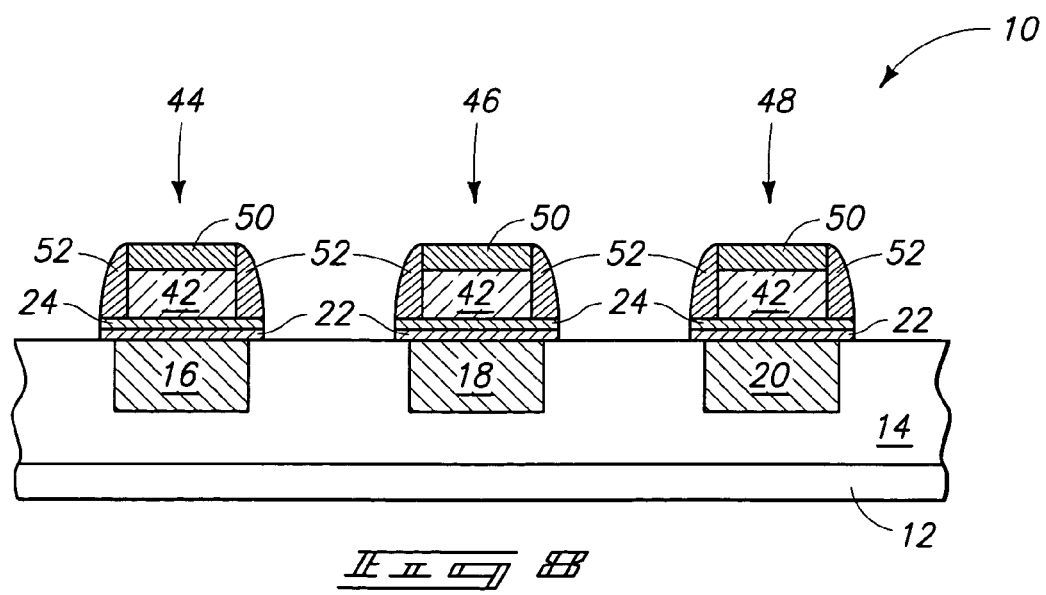
FIG. 8 is a view of the FIG. 1 wafer fragment shown at a processing stage subsequent to that of FIG. 7.

Referring to FIG. 8, exposed portions of the second regions of layers 22 and 24 are removed. Such can be accomplished with a dry etch selective for the materials of the layers 22 and 24 relative to the protective materials 50 and 52 (or if protective materials are thick enough, the etch can be relatively non-selective).

If the dry etch is highly anisotropic, protective material 52 can be omitted. The dry etch can then be conducted while protecting the top surface of material 42 with caps 50, and leaving the side surfaces 43 of material 42 exposed since the highly anisotropic dry etch will have little lateral penetration into material 42. However, in typical applications it can be desired to protect sidewalls 43 of material 42 with protective layer 52, in that dry etches are generally not sufficiently anisotropic to avoid some lateral penetration into unprotected sidewall surfaces of material 42 during the dry etching.

Any suitable dry etch can be utilized, including, for example, fluorine-based chemistry for etching TaN.

The sidewall protection material 52 protects some of the defined second regions 31, 33, 35 and 37 (FIGS. 2, 3 and 5) of layers 22 and 24 during the dry etch of FIG. 8, so that only portions of such defined second regions are removed. In applications in which protective layer 52 is omitted, an entirety of the defined second regions of layers 22 and 24 would be removed. Regardless, regions of layers 22 and 24 are removed to expose an underlying surface of the insulative material 14 so that lines 44, 46 and 48 are electrically isolated from one another.

It is noted that another approach to obtaining the construction of FIG. 8 from that of FIG. 4 can be to remove material 40 (FIG. 4) initially, then to selectively form material 50 around material 42 but not on material 24 (the material 50 could then form the cap of FIGS. 6 and 7 as well as the sidewalls of FIG. 7), and then to etch materials 24 and 22.

Figure 9:
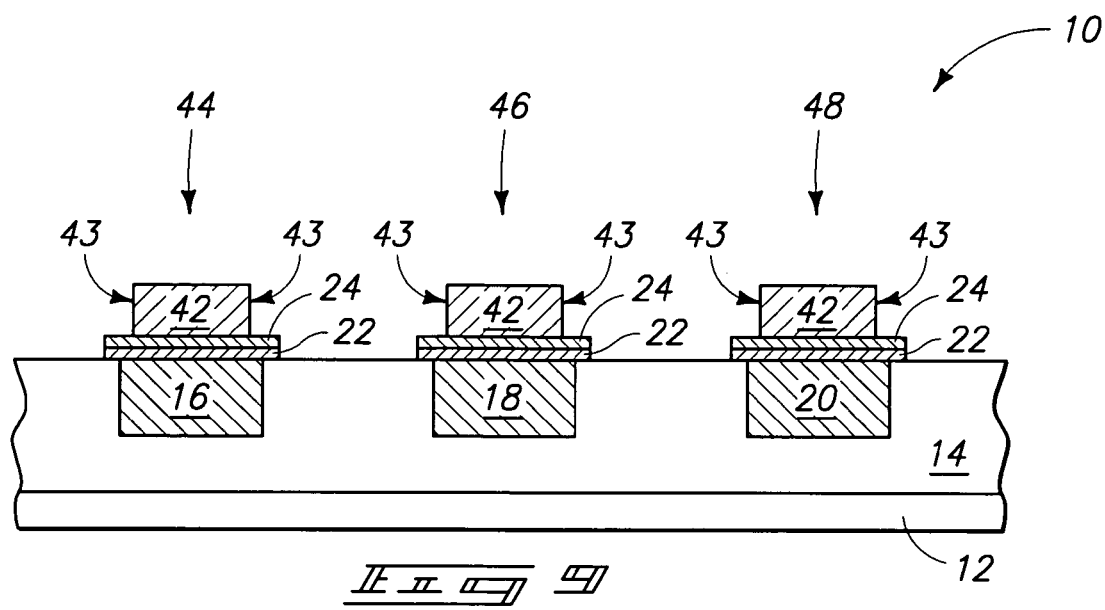
FIG. 9 is a view of the FIG. 1 wafer fragment shown at a processing stage subsequent to that of FIG. 8.

Referring next to FIG. 9, protective materials 50 and 52 (FIG. 8) can be removed with a suitable wet etch. In applications in which the protective layers comprise one or more of nickel, cobalt, phosphorus-doped cobalt tungsten, boron-doped cobalt tungsten, phosphorus-doped nickel, phosphorus-doped cobalt, phosphorus-doped nickel molybdenum and boron-doped nickel molybdenum, the wet etch can utilize one or more of hydrofluoric acid, nitric acid, sulfuric acid and acetic acid.

The structure of FIG. 9 comprises spaced lines 44, 46 and 48 of material 42 in one-to-one correspondence with spaced conductive nodes 16, 18 and 20. The conductive lines of material 42 are electrically coupled to the underlying conductive nodes through layers 22 and 24, with layers 22 and 24 together forming blocks provided between the nodes and the lines.

In the shown aspect of the invention, the blocks comprising layers 22 and 24 extend laterally outwardly beyond sidewall surfaces 43 of lines 44, 46 and 48. This results from utilization of protective material 52 (FIG. 8). In applications in which material 52 is omitted, the blocks comprising layers 22 and 24 can have lateral sidewalls which are laterally coextensive with the sidewalls 43 of lines 44, 46 and 48.

Figure 10:
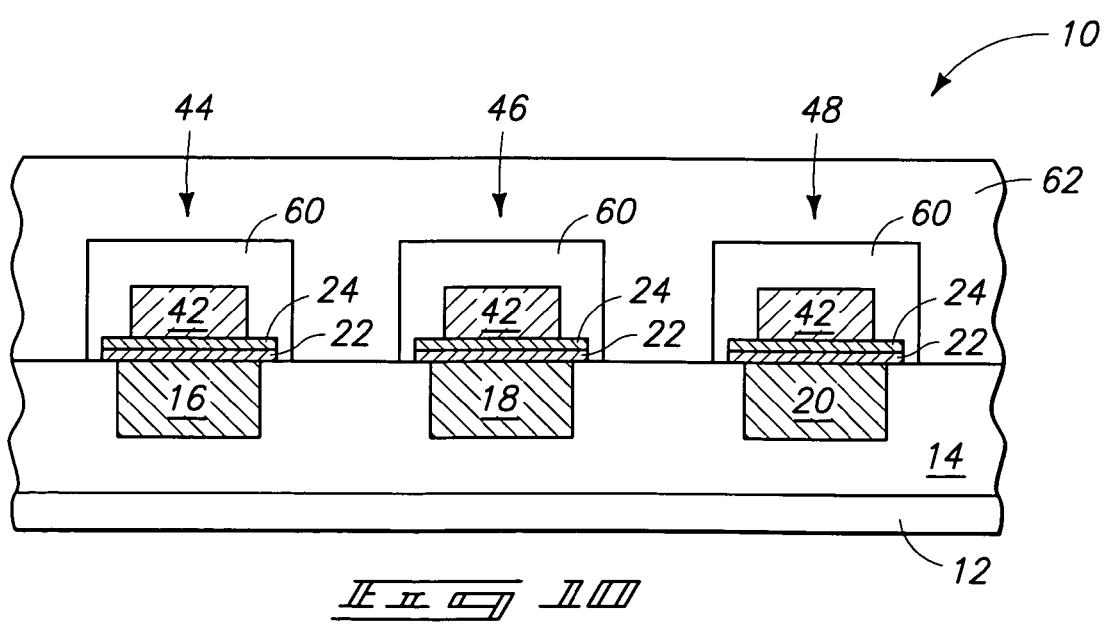
FIG. 10 is a view of the FIG. 1 wafer fragment shown at a processing stage subsequent to that of FIG. 9.

Referring to FIG. 10, construction 10 is illustrated after a material 60 has been provided around lines 44, 46 and 48. Material 60 can be a passivation material, cladding material, barrier material, etc., and can be electrically conductive in some aspects of the invention, or electrically insulative in other aspects.

After formation of material 60, an electrically insulative material 62 is formed to extend over and around the lines 44, 46 and 48. In some aspects of the invention, material 60 can be omitted, and electrically insulative material 62 can be provided directly against the lines.

The construction of FIG. 10 advantageously has barrier layer 22 provided between underlying silicon-containing materials (such as, for example, materials in substrate 12 and/or materials in region 14) and the overlying material 42 of the lines. Such can impede, and preferably prevent, silicon migration into the conductive materials of the lines in exemplary applications. The barrier layer can also impede other undesired migration of materials between the conductive material 42 and the underlying supporting substrate in applications of the invention.

The shown lines are exemplary conductive structures formed over layers 22 and 24, and it is to be understood that other types of conductive structures can be formed over the layers 22 and 24 in other aspects of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of electrically conductive structures, comprising:
   providing a semiconductor substrate;
   forming at least one electrically conductive layer across the substrate; the at least one electrically conductive layer having defined first regions and defined second regions between the first regions; the at least one electrically conductive layer comprising a compositional gradient extending at least partially therethrough;
   providing a material to cover said second regions while leaving said first regions uncovered;
   forming a plurality of spaced electrically conductive structures within the first regions, the structures being spaced from one another by the material;
   forming a protective layer over the electrically conductive structures, the protective layer having an upper surface at a first elevational height with respect to a cross-sectional view of the conductive structures;
   after forming the protective layer, removing the material and removing at least some of the second regions of the at least one electrically conductive layer; and
   after removing the second regions of the at least one electrically conductive layer, removing the protective layer thereby exposing upper surfaces of the conductive structures, the upper surfaces of the conductive structures being at a second elevational height with respect to the cross-sectional view of the conductive structures that is lower than the first elevational height.

2. The method of claim 1 wherein the compositional gradient is a tantalum nitride/tantalum gradient.

3. The method of claim 1 wherein the compositional gradient is a tungsten/cobalt gradient.

4. The method of claim 1 wherein the protective layer is of a different composition than the electrically conductive structures and comprises one or more of nickel, cobalt, phosphorus-doped nickel molybdenum, boron-doped nickel molybdenum, phosphorus-doped cobalt tungsten, and boron-doped cobalt tungsten.

5. The method of claim 4 wherein the forming of the protective layer comprises electroplating of electrically conductive material onto the electrically conductive structures.

6. The method of claim 4 wherein the forming of the protective layer comprises electroless deposition of electrically conductive material onto the electrically conductive structures.

7. A method of forming a plurality of electrically conductive lines, comprising:
   providing a semiconductor substrate having a plurality of spaced electrically conductive nodes supported thereby, the nodes having uppermost surfaces;
   forming at least one electrically conductive layer across the substrate and in direct physical contact with the uppermost surfaces of the nodes; the at least one electrically conductive layer having defined first regions extending at least partially across the nodes and defined second regions between the first regions;
   after the forming of the at least one electrically conductive layer, providing a material to cover said second regions while leaving said first regions uncovered, the material being directly above said second regions;
   forming a plurality of spaced electrically conductive lines physically distinct from and above the at least one electrically conductive layer and within the first regions, the lines being spaced from one another by the material, first upper surfaces of the lines being at a first elevational height with respect to a cross-sectional view of the lines;
   forming a protective layer over the electrically conductive lines, an upper surface of the protective layer having a second elevational height with respect to the cross-sectional view, the second elevational height being higher than the first elevational height;
   after forming the protective layer, removing the material and removing at least some of the second regions of the at least one electrically conductive layer; and
   after removing the second regions of the at least one electrically conductive layer, removing the protective layer, thereby exposing second upper surfaces of the lines, the second upper surfaces being at a third elevational height lower than the second elevational height.

8. The method of claim 7 wherein the at least one electrically conductive layer includes a layer having a tantalum nitride/tantalum gradient therein.

9. The method of claim 7 wherein the at least one electrically conductive layer includes a layer having a tungsten/cobalt gradient therein.

10. The method of claim 7 wherein the at least one electrically conductive layer includes a layer comprising phosphorus-doped cobalt tungsten.

11. The method of claim 7 wherein the at least one electrically conductive layer is a single electrically conductive layer.

12. The method of claim 7 wherein the at least one electrically conductive layer is at least two electrically conductive layers.

13. The method of claim 12 wherein one layer of the at least two electrically conductive layers has a tantalum nitride/tantalum gradient therein, the gradient having a first region with a relatively high ratio of tantalum nitride/tantalum and a second region with a relatively low ratio of tantalum nitride/tantalum; the first region being in direct physical contact with the uppermost surfaces of the nodes.

14. The method of claim 13 wherein said first region consists of tantalum nitride and said second region consists of tantalum.

15. The method of claim 13 wherein the at least two electrically conductive layers comprise a second layer over said one layer, the second layer comprising one or more of cobalt, copper, nickel, ruthenium and tungsten.

16. The method of claim 7 wherein the protective layer is a first protective layer; wherein the removal of the material exposes sidewalls of the electrically conductive lines; and further comprising, after removing the material and before removing the second regions of the at least one electrically conductive layer, forming a second protective layer along the exposed sidewalls of the electrically conductive lines.

17. A method of forming a plurality of electrically conductive lines, comprising:
providing a substrate having a plurality of conductive surfaces;
forming a gradient-containing material across the substrate and in direct physical contact with conductive surfaces; the gradient-containing material consisting essentially of tantalum nitride at a lowermost portion in contact with the conductive surfaces, consisting essentially of tantalum at an uppermost portion, and having a tantalum nitride/tantalum gradient extending between the lowermost and uppermost portions; the gradient-containing material having defined first regions directly over the conductive surfaces and defined second regions between the first regions;
forming a sacrificial material over the gradient-containing material and having openings extending therethrough to the defined first regions;
forming a plurality of spaced electrically conductive lines within the openings, the lines being spaced from one another by the sacrificial material, and the lines having upper surfaces
forming caps to protect the electrically conductive lines, the caps comprising a material resistant to an etch and the caps being in physical contact with the upper surfaces of the lines;
while the caps protect the electrically conductive lines, removing the sacrificial material and then utilizing the etch to remove at least some of the second regions of the gradient-containing material; and
after removing the sacrificial material, removing the caps thereby exposing at least portions of the upper surfaces of the lines.

18. The method of claim 17 further comprising forming a layer over said gradient-containing material prior to forming the sacrificial material, the layer comprising one or more of cobalt, copper, nickel, ruthenium and tungsten; the sacrificial material being formed in direct physical contact with said layer.

19. The method of claim 17 wherein the electrically conductive lines comprise one or more of copper, cobalt and nickel; and wherein the caps are of a different composition than the electrically conductive lines and comprise one or more of nickel, cobalt, boron-doped nickel molybdenum, phosphorus-doped nickel molybdenum, phosphorus-doped cobalt tungsten, and boron-doped cobalt tungsten.

20. The method of claim 17 wherein:
the electrically conductive lines comprise one or more of copper, cobalt and nickel;
the caps are of a different composition than the electrically conductive lines and comprise one or more of nickel, cobalt, phosphorus-doped cobalt tungsten, and boron-doped cobalt tungsten; and
the etch is a wet etch utilizing one or more of hydrofluoric acid, nitric acid and acetic acid.

21. The method of claim 17 wherein the removal of the sacrificial material exposes sidewalls of the electrically conductive lines; and further comprising, after removing the sacrificial material, after forming the caps, and before removing the second regions of the gradient-containing material, forming a protective layer along the exposed sidewalls of the electrically conductive lines, the protective layer being distinct from the caps.

22. A method of forming a plurality of electrically conductive lines, comprising:
providing a semiconductor substrate having a plurality of spaced electrically conductive nodes supported thereby, the nodes have exposed uppermost surfaces;
forming a first electrically conductive material across the substrate and in direct physical contact with the uppermost surfaces of the nodes; the first electrically conductive material consisting essentially of tantalum nitride at a lowermost portion proximate the nodes and consisting essentially of tantalum at an uppermost portion; the first electrically conductive material comprising a tantalum nitride/tantalum gradient extending from the lowermost portion to the uppermost portion;
forming a second electrically conductive material over and in direct physical contact with the first electrically conductive material; the second electrically conductive material having a different composition than the first electrically conductive material; the first and second electrically conductive materials having defined first regions extending over the nodes and defined second regions between the first regions;
forming a mask over the second electrically conductive material, the mask having openings extending therethrough to the first regions of the second electrically conductive material;
forming a plurality of spaced electrically conductive lines within the openings, the lines being spaced from one another by the mask;
forming caps to protect the electrically conductive lines, the caps comprising a material resistant to an etch and the caps being in physical contact with upper surfaces of the electrically conductive lines;

after forming the spaced conductive lines and while the caps protect the electrically conductive lines, removing the mask and then utilizing the etch to remove at least some of the second regions of the first and second electrically conductive material; and after the removing of the mask, removing the caps.

23. The method of claim 22 further comprising:

forming a protective layer over the electrically conductive lines;

removing the mask and second regions of the first and second electrically conductive materials while the protective layer is over the electrically conductive lines; and removing the protective layer.

24. The method of claim 23 wherein the protective layer is of a different composition than the electrically conductive lines and comprises one or more of nickel, cobalt, phosphorus-doped cobalt tungsten, and boron-doped cobalt tungsten.

25. The method of claim 23 wherein the protective layer is a first protective layer; wherein the removal of the mask exposes sidewalls of the electrically conductive lines; and further comprising, after removing the mask and before removing the second regions of the first and second electrically conductive materials, forming a second protective layer along the exposed sidewalls of the electrically conductive lines.

26. The method of claim 22 wherein the tantalum nitride/tantalum gradient is a linear gradient.

27. The method of claim 7 wherein the third elevational height is lower than or equal to the first elevational height.

28. The method of claim 7 wherein the protective layer comprises a material resistant to an etch and the removing of at least some of the second regions of the at least one electrically conductive layer comprises removing using the etch.

* * * * *

UNITED STATES PATENT AND TRADEMARK OFFICE
CERTIFICATE OF CORRECTION

PATENT NO. : 7,666,776 B2
APPLICATION NO. : 11/218232
DATED : February 23, 2010
INVENTOR(S) : Dale W. Collins et al.

It is certified that error appears in the above-identified patent and that said Letters Patent is hereby corrected as shown below:

In column 11, line 59, in Claim 17, delete "surfaces" and insert -- surfaces; --, therefor.

In column 13, line 5, in Claim 22, delete "material;" and insert -- materials; --, therefor.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,666,776 B2  Page 1 of 1
APPLICATION NO. : 11/218232
DATED : February 23, 2010
INVENTOR(S) : Dale W. Collins et al.

It is certified that error appears in the above-identified patent and that said Letters Patent is hereby corrected as shown below:

Title Page, Item [*]

Delete the phrase "by 408 days" and insert -- by 707 days --.

Signed and Sealed this

Twenty-fourth Day of August, 2010

David J. Kappos
*Director of the United States Patent and Trademark Office*